(12) United States Patent
Kurauchi et al.

(10) Patent No.: US 7,626,337 B2
(45) Date of Patent: Dec. 1, 2009

(54) PROTECTIVE FILM FOR PLASMA DISPLAY PANEL AND METHOD FOR MANUFACTURING THIS PROTECTIVE FILM, AND PLASMA DISPLAY PANEL AND METHOD FOR MANUFACTURING THEREOF

(75) Inventors: Toshiharu Kurauchi, Ibaraki (JP); Muneto Hakomori, Kanagawa (JP); Kazuya Uchida, Ibaraki (JP); Shunji Misawa, Ibaraki (JP)

(73) Assignee: Ulvac, Inc., Chigasaki-shi (JP)

( * ) Notice: Subject to any disclaimer, the term of this patent is extended or adjusted under 35 U.S.C. 154(b) by 0 days.

(21) Appl. No.: 11/594,987

(22) Filed: Nov. 9, 2006

(65) Prior Publication Data

US 2007/0108905 A1 May 17, 2007

Related U.S. Application Data

(63) Continuation of application No. PCT/JP2005/019993, filed on Oct. 31, 2005.

(30) Foreign Application Priority Data

Nov. 5, 2004 (JP) ............... 2004-321820

(51) Int. Cl.
*H01J 17/49* (2006.01)
(52) U.S. Cl. .................. 313/587; 313/582; 313/584; 313/585
(58) Field of Classification Search .............. None
See application file for complete search history.

(56) References Cited

U.S. PATENT DOCUMENTS 4,198,585 A * 4/1980 Yamashita et al. .......... 313/587
5,993,543 A * 11/1999 Aoki et al. .................. 117/88
6,414,445 B2 * 7/2002 Van Heusden et al. ... 315/169.4

(Continued)

FOREIGN PATENT DOCUMENTS

JP 11-339665 12/1999

(Continued)

OTHER PUBLICATIONS

Machine English translation of JP 2002-294432 to Sakurai et al.*

(Continued)

*Primary Examiner*—Sikha Roy
(74) *Attorney, Agent, or Firm*—Kratz, Quintos & Hanson, LLP

(57) ABSTRACT

A plasma display panel 1 of the present invention has a protective film 14 over a sustaining electrode 15 and a scanning electrode 16, with the main components of the protective film being CaO and SrO, and the concentration of the CaO in the protective film 14 is 20 mol % or more and 90 mol % or less. This protective film 14 has a smaller work function than a conventional MgO film so light can be emitted at a lower discharge voltage than in the past. If the discharge voltage is lower, the protective film 14 will be sputtered more slowly so that the service life of the plasma display panel 1 will be longer. Also, since the plasma-gas contains xenon gas, the plasma display panel of the present invention has higher brightness.

3 Claims, 2 Drawing Sheets

U.S. PATENT DOCUMENTS 7,215,303 B2 * 5/2007 Ando et al. .................. 345/60
2004/0061442 A1 * 4/2004 Yuki et al. .................. 313/586

FOREIGN PATENT DOCUMENTS

| JP | 2000-1771 | 1/2000 |
| JP | 2002-93327 | 3/2002 |
| JP | 2002-231129 | 8/2002 |
| JP | 2002-294432 | 10/2002 |
| JP | 2003-132792 | 5/2003 |
| JP | 2004-241309 | 8/2004 |
| JP | 2004-281081 | 10/2004 |

OTHER PUBLICATIONS

International Search Report dated Dec. 27, 2005.

* cited by examiner

PROTECTIVE FILM FOR PLASMA DISPLAY PANEL AND METHOD FOR MANUFACTURING THIS PROTECTIVE FILM, AND PLASMA DISPLAY PANEL AND METHOD FOR MANUFACTURING THEREOF

CROSS-REFERENCE TO RELATED APPLICATIONS

This application claims priority benefit of Japanese Application No. 2004-321820, filed on Nov. 5, 2004, the entire disclosure of which is incorporated herein by reference.

This application is a continuation of International Application No. PCT/JP2005/019993, filed on Oct. 31, 2005, the entire disclosure of which is incorporated herein by reference.

FIELD OF THE INVENTION

The present invention relates to a plasma display panel, and more particularly to a protective film for this panel, and to a method for manufacturing a protective film.

BACKGROUND OF THE INVENTION

PDPs (plasma display panels) have been widely used in the field of display devices in the past, and a larger screen, higher quality, and lower cost have been required of PDPs in recent years.

A three-electrode surface discharge type, which is made up of a front panel comprising a sustaining electrode and a scanning electrode formed on a glass substrate, and a rear panel comprising an address electrode formed on a glass substrate, with these panels put together, is generally coming to the main current of PDP.

An inert gas is enclosed between the front and rear panels, and voltage is applied between the scanning electrode and the address electrode to create a discharge, whereupon the inert gas is plasmatized so that ultraviolet rays are emitted. If a fluorescent film is disposed at the location where the emitted ultraviolet rays are irradiated, the ultraviolet rays will cause the fluorescent film to luminesce and emit colored light.

A dielectric film is usually formed over the sustaining electrode and the scanning electrode; and an MgO protective film is formed over this dielectric film to protect it.

When AC voltage is applied to the scanning electrode and the sustaining electrode to sustain discharge, cations generated by plasmatizing the inert gas are incident on the scanning electrode side and the sustaining electrode side, respectively. However, the scanning electrode and the sustaining electrode, and the dielectric film over these electrodes, are protected against the cations by the protective film.

Therefore, the dielectric film is not damaged by the plasma, and the sustaining electrode and scanning electrode are maintained in a state of being insulated by the dielectric film; and furthermore, since there is no change in the electrostatic capacitance of the dielectric film, the electrical characteristics of the plasma display panel are maintained.

In order to increase the brightness of a PDP in response to the growing requirements for higher performance in recent years, a method has been proposed in which luminescent intensity is increased by raising the concentration of xenon in a mixed gas of neon and xenon, which is usually used as the inert gas, from the conventional level of about 5% to 10% or higher.

However, when the protective film is made of MgO, if the xenon concentration in the inert gas is raised, the discharge voltage goes up, anti-sputtering property of the protective film decrease, and the function as a protective film subsequently declines. Therefore, there has been a problem of shortening a panel service life. There also has been a problem of increasing in cost of manufacturing a PDP drive control system because the driver circuit for driving the PDP must be able to handle higher voltage.

The discharge voltage of a PDP depends on the secondary electron emission coefficient of the protective film. It has been proposed that the discharge voltage is possible to be reduced if an oxide of an alkaline earth metal, which has a smaller work function than MgO, is used as the protective film.

For instance, Japanese Laid-Open Patent Application 2002-231129 (patent document 1) introduces SrO, CaO, BaO, SrO+BaO, BaO+CaO, and SrO+CaO+BaO as protective films.

These protective films are less resistant against sputtering by cations during discharge than MgO is, and are disadvantageous in terms of PDP service life such that technology attempts to solve the problem of shorter service life by forming a protective film not only on the front panel of a PDP, but also on the rear panel where at least a fluorescent film is formed.

However, a problem encountered on carrying out the above prior art is that increasing the protective film formation steps drives up the cost of manufacturing a PDP. Another problem that remains to be solved is that aging treatment of the protective film, which is considered necessary at the outset of discharge, takes as long or longer than with MgO. The present invention provides a protective film that has superior anti-sputtering property and lower discharge voltage than an MgO film, and a method for forming this protective film, as well as a PDP manufacturing method for shortening the time for the initial discharge aging treatment of the PDP in which this protective film is used.

SUMMARY OF THE INVENTION

In order to solve the above problems, embodiments of the present invention include a protective film disposed on the surface of one or both of first and second electrodes, which is exposed to a plasma formed between the first and second electrodes when voltage is applied between the first and second electrodes, wherein said protective film contains SrO and CaO, and the CaO content is 20 mol % or more and 90 mol % or less.

Embodiments of the present invention include a protective film, wherein the first electrode is disposed on the surface of a first panel, and the second electrode is disposed on the surface of a second panel.

Embodiments of the present invention include a plasma display panel, having a first panel with a first electrode disposed on its surface, and a second panel with a second electrode disposed on its surface, an inert gas being charged in between the first and second panels, a protective film being disposed on the surface of one or both of the first and second electrodes, the protective film being exposed to a plasma formed between the first and second panels, wherein said protective film contains SrO and CaO, and the CaO content is 20 mol % or more and 90 mol % or less.

Embodiments of the present invention include a plasma display panel wherein a third electrode is disposed on the surface of the first panel.

Embodiments of the present invention include a plasma display panel wherein the inert gas contains neon and xenon, and the xenon content is at least 10 vol %.

Embodiments of the present invention include a method for manufacturing a protective film, in which a protective film containing SrO and CaO is formed, wherein a first vapor deposition material whose main component is SrO and a second vapor deposition material whose main component is CaO are separately disposed inside the same vacuum chamber, and the amounts of vapor generated from the first and second vapor deposition materials are controlled and the first and second vapor deposition materials are vaporized such that the CaO content in the protective film will be 20 mol % or more and 90 mol % or less.

Embodiments of the present invention include a method for manufacturing a protective film, in which the protective film is formed over a first panel with a first electrode disposed on its surface, and a second panel with a second electrode disposed on its surface, wherein a dielectric film is disposed over one or both of the first and second electrodes; and the protective film is formed on a surface of the dielectric film by allowing each of the vapors of the first and second vapor deposition materials to reach the dielectric film.

Embodiments of the present invention include a method for manufacturing a plasma display panel, comprising the steps of disposing separately a first vapor deposition material containing SrO, and a second vapor deposition material containing CaO inside the same vacuum chamber; forming a protective film containing SrO and CaO, with the CaO content being 20 mol % or more and 90 mol % or less, on the surfaces of first and second panels by heating the first and second vapor deposition materials while controlling the amounts of vapor generated; and adhering the first and second panels together and sealing them, wherein everything at least from the step of forming the protective film to the sealing step is carried out in a vacuum atmosphere.

The present invention is constituted as above, and a display device in which the protective film of the present invention is used has first and second electrodes. An inert gas that forms a plasma is charged into this device, and voltage is applied between the first and second electrodes, whereupon a plasma of the inert gas is formed inside the device, and the cations in the plasma are attracted to whichever of the first and second electrodes located on the negative potential side.

When DC voltage is applied between the first and second electrodes, if the protective film of the present invention is disposed over at least the electrode to which the negative potential is applied. Alternatively, when AC voltage is applied between the first and second electrodes, if the protective film of the present invention is disposed over one or both electrodes, the electrode or electrodes and the surrounding members will be protected from cations by the protective film.

With the above-mentioned plasma display panel in which a sustaining electrode and a scanning electrode are disposed on a first panel, and an address electrode on a second panel, the first and second electrodes are either a combination of the sustaining electrode and the address electrode, or a combination of the scanning electrode and the address electrode.

More particularly, the protective film of the present invention may be disposed over both the sustaining electrode and the scanning electrode with the above-mentioned plasma display panel since a plasma is formed by applying a high AC voltage between the sustaining electrode and the scanning electrode.

In general, with a plasma display panel, a dielectric film is disposed over a sustaining electrode and a scanning electrode so that the protective film of the present invention may be disposed over the dielectric film surface on the sustaining electrode, and over the dielectric film surface on the scanning electrode so that the dielectric film can be protected.

The protective film used in the present invention contains both SrO and CaO, and the CaO concentration in the protective film of the present invention is 20 mol % or more and 90 mol % or less; and therefore, resistance against sputtering by cations during discharge is better than with a conventional protective film (MgO film), and the discharge voltage of the PDP is lower. Consequently, the service life of the panel is extended, and the cost of the driver circuit used to drive the PDP is reduced.

If, in order to increase the brightness of a plasma display panel, the inert gas is a mixed gas of neon and xenon, and the xenon is contained in an amount of at least 10 vol %, discharge voltage will increase and the protective film will be more easy to be etched. However, it does not lead to shorter panel service life since the protective film of the present invention has high anti-sputtering property.

According to the present invention, it is possible to stably form a PDP protective film with excellent electron emission characteristics which is composed of the protective film of the present invention containing both SrO and CaO. Also, the xenon concentration is raised in the mixed gas of neon and xenon that is charged into the PDP, which increases the brightness and allows a PDP with a long service life to be manufactured at low cost.

DETAILED DESCRIPTION OF THE PREFERRED EMBODIMENTS

Figure 1:
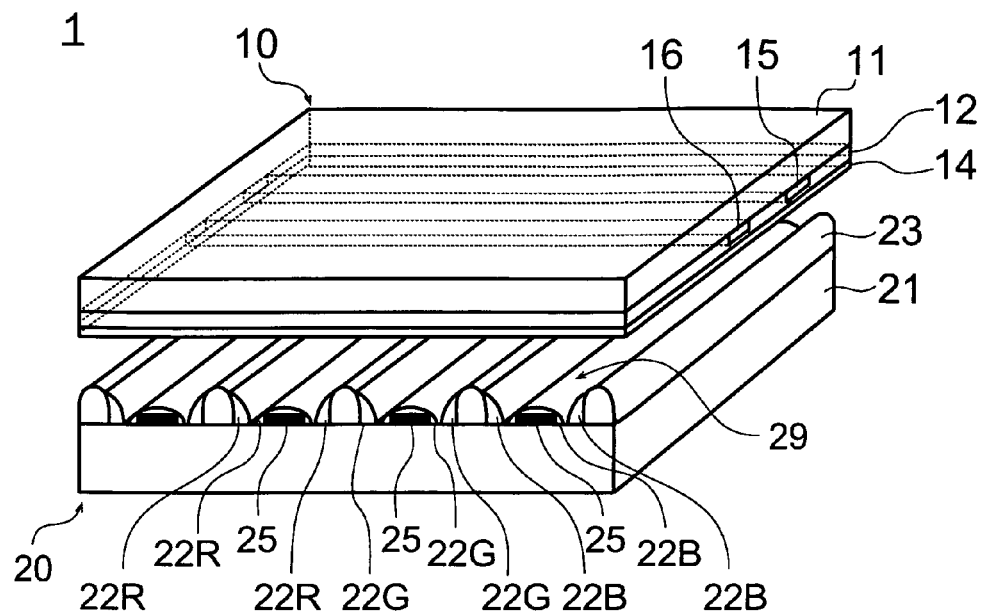
FIG. 1 is a perspective view illustrating an example of the plasma display panel of the present invention.

In FIG. 1, reference numeral 1 indicates an example of the plasma display panel of the present invention. This plasma display panel 1 has first and second panels 10, 20.

The first panel 10 has a first glass substrate 11, and a plurality of sustaining electrodes 15 and scanning electrodes 16 are respectively disposed on the surface of the first glass substrate 11. In FIG. 1, just one sustaining electrode 15 and one scanning electrode 16 are depicted.

Here, each sustaining electrode 15 and each scanning electrode 16 has a long, narrow shape, and the sustaining electrodes 15 and scanning electrodes 16 are alternately lined up next to each other, with a predetermined gap in between, on the surface of the first glass substrate 11.

A dielectric film 12 made of an insulating material is disposed on the surface of the first glass substrate 11 on which the sustaining electrodes 15 and scanning electrodes 16 are disposed. Adjacent sustaining electrodes 15 and scanning electrodes 16 are spaced from each other, the dielectric film 12 is formed so as to cover the top and sides of the sustaining electrodes 15 and scanning electrodes 16; and the spaces between adjacent sustaining electrodes 15 and scanning electrodes 16 are filled with the dielectric film 12 so that the sustaining electrodes 15 and the scanning electrodes 16 are insulated from one another.

A protective film 14, having main components that are both SrO and CaO, is disposed over the entire surface of the dielectric film 12; and therefore, the protective film 14 is disposed over each of the sustaining electrodes 15 and each of the scanning electrodes 16.

The second panel 20 has the second glass substrate 21. A plurality of linear address electrodes 25 are disposed in parallel, with a specific gap therebetween, on the surface of the second glass substrate 21.

Slender barrier ribs 23 are disposed in the lengthwise direction of the address electrodes 25 in between the address electrodes 25 on the surface of the second glass substrate 21.

One of three fluorescent films containing fluorescent colorants of different colors (a red fluorescent film 22R, a green fluorescent film 22G, and a blue fluorescent film 22B) is disposed between each pair of adjacent barrier ribs 23 so that each of the address electrodes 25 is covered by a fluorescent film of one color (22R, 22G, or 22B).

The first and second panels 10 and 20 are adhered together in a state in which the surface where the protective film 14 is exposed faces the surface on which the barrier ribs 23 are formed; and the sustaining electrodes 15 and the scanning electrodes 16 are perpendicular to the address electrodes 25. The height from the surface of the second glass substrate 21 to the ends of the barrier ribs 23 is greater than the height from the surface of the second glass substrate 21 to the surface of the address electrodes 25 so the distal ends of the barrier ribs 23 come into contact with the protective film 14 of the first panel 10, and the space between the protective film 14 and the fluorescent films 22R, 22G, and 22B is partitioned by the barrier ribs 23.

Reference numeral 29 in FIG. 1 indicates a luminescence space, consisting of the spaces over the fluorescent films 22R, 22G, and 22B partitioned by the barrier ribs 23, and the luminescence spaces 29 are filled with an inert gas that is a mixture of neon gas and xenon gas, and contains equal to or more than 10 vol % xenon gas.

The process by which this plasma display panel 1 is lighted will now be described.

When voltage is applied between a selected scanning electrode 16 and address electrode 25, write discharge occurs in the luminescent cell where these electrodes intersect.

AC voltage is then applied between the scanning electrode 16 to which the above voltage was applied and the sustaining electrode 15 corresponding to this scanning electrode 16, which brings about sustaining discharge.

As discussed above, the protective film 14 of the present invention is positioned over the sustaining electrodes 15 and the scanning electrodes 16, with the dielectric film 12 sandwiched in between, this protective film 14 containing both SrO and CaO as main components, and the CaO concentration thereof being 20 mol % or more and 90 mol % or less.

Because the protective film of the present invention has higher electron discharge characteristics than a conventional protective film (MgO film), even when the xenon concentration of the inert gas is raised, sustaining discharge is brought about at a relatively low discharge voltage, the sustaining discharge converts the inert gas into a plasma, and ultraviolet rays are generated.

Accordingly, the surfaces of the first and second panels 10 and 20 are exposed to the plasma by plasmatizing the inert gas, but the dielectric film 12 is protected against etching by the plasma since the protective film 14 is disposed over the surface of the dielectric film 12.

As discussed above, the plasma display panel 1 of the present invention can be driven at a low discharge voltage, which means that even though the protective film 14 is exposed to the inert gas plasma, it is etched only very slowly. Therefore, the plasma display panel 1 of the present invention has a longer service life than conventional plasma display panels.

As discussed above, the sustaining electrodes 15 and the scanning electrodes 16 are disposed perpendicular to the address electrodes 25, and luminescence occurs at the luminescent cells where the selected scanning electrodes 16 intersect with the address electrodes 25.

When ultraviolet light is emitted at the luminescent cells, and UV rays are incident on the fluorescent films 22R, 22G, and 22B located in these luminescent cells, visible light of either red, green, or blue is emitted from the fluorescent films 22R, 22G, and 22B.

In order to extinguish the luminescent cells, a voltage weaker than that during the sustaining discharge is applied between the selected scanning electrodes 16 and the sustaining electrodes 15 adjacent to those scanning electrodes 16, which brings about a discharge (erasing discharge) that is weaker than the sustaining discharge; and this neutralizes the wall charge within the luminescence spaces 29 and extinguishes the luminescent cells.

Next, an example of the process of forming the protective film 14 of the present invention will be described.

Figure 2:
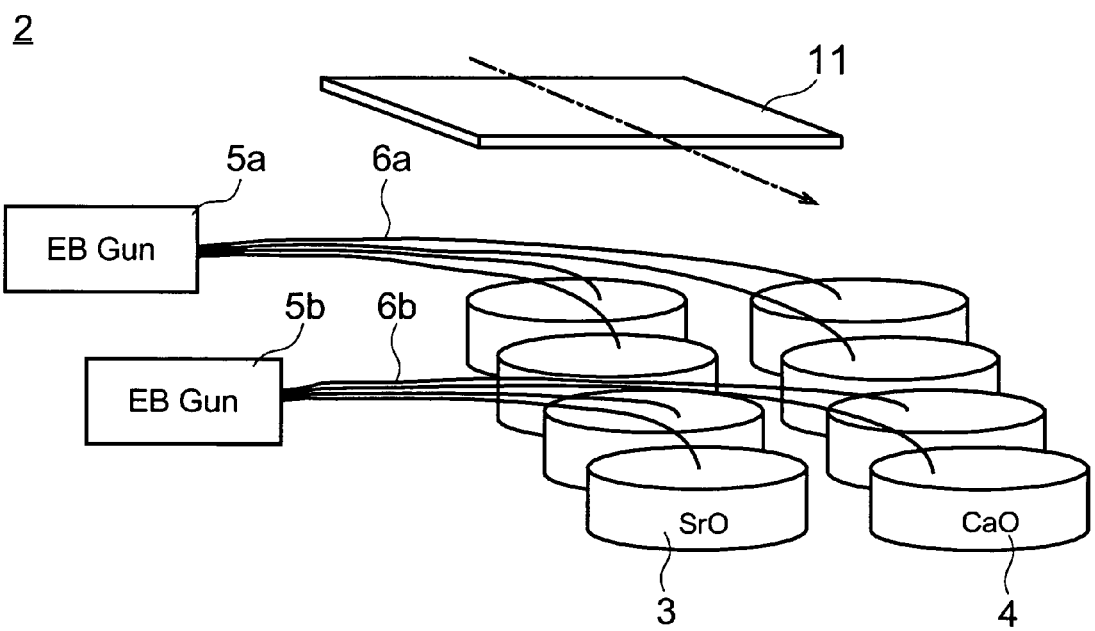
FIG. 2 is a perspective view illustrating the method for manufacturing a plasma display panel of the present invention.

Reference numeral 2 in FIG. 2 indicates an example of a film formation apparatus. This film formation apparatus 2 comprises two electron beam guns (EB guns) 5a and 5b, and first and second hearths 3 and 4 (four each). A first vapor deposition material composed of SrO is disposed on each of the first hearths 3, and a second vapor deposition material composed of CaO is disposed on each of the second hearths.

The first hearths 3 are arranged in a row inside a vacuum chamber, and the second hearths 4 are arranged parallel and next to the first hearths 3 inside the same vacuum chamber as the first hearths 3.

The inside of this vacuum chamber is evacuated ahead of time, each of the first hearths 3 and each of the second hearths 4 are placed in the same vacuum atmosphere. While this vacuum atmosphere is maintained, electron beams 6a, 6b are emitted from the electron beam guns 5a, 5b into the hearths 3, 4, whereupon SrO is vaporized from within the first hearths 3 and CaO from within the second hearths 4 so that SrO vapor and CaO vapor are released within the vacuum atmosphere.

The first glass substrate 11, on the surface of which the sustaining electrodes 15, the scanning electrodes 16, and the dielectric film 12 have been formed, is conveyed through this vacuum atmosphere and is transferred above and parallel to the first and second hearths 3, 4 with the surface on which the sustaining electrodes 15 and scanning electrodes 16 were formed facing down.

Since the row of first hearths 3 and the row of second hearths 4 are disposed close together, when the first glass substrate 11 passes above first and second hearths 3, 4, the SrO vapor and CaO vapor both reach the first glass substrate 11.

The first panel 10 will be obtained with a protective film 14 that contains the predetermined proportions of SrO and CaO formed over the first glass substrate 11 if the amount of SrO vapor generated and the amount of CaO vapor generated are controlled to predetermined proportions by varying the first and second hearths 3, 4 to be irradiated with the beams by adjusting the beam path, or by adjusting the beam irradiation time and the beam irradiation intensity to each of the first and second hearths 3, 4.

The number of first and second hearths 3, 4 is not limited to four each in the method for forming the protective film of the present invention, and there may be from one to three of each of the first and second hearths 3, 4, or there may be five or more of each. Also, the first and second hearths 3, 4 may be disposed in the same number within the vacuum chamber, or different numbers of first and second hearths 3, 4 may be disposed. In other words, as long as the SrO and CaO can be disposed independently in the same vacuum chamber, neither the shape nor the number of the first and second hearths 3, 4 is limited in any particular way.

The number of electron beam guns 5a, 5b is also not limited to two, and as long as the first and second hearths 3, 4 can both be irradiated with electron beams, just one gun, or three or more, may be used.

The first panel 10 on which the protective film 14 has been formed is conveyed through the vacuum atmosphere without being exposed to the outside atmosphere, the first panel 10 and the above-mentioned second panel 20 are conveyed into the same heating vacuum chamber. Then, with the inside of the heating vacuum chamber maintained under a vacuum atmosphere, the surface of the first panel 10 on which the sustaining electrodes 15 and the scanning electrodes 16 have been formed is opposed to the surface of the second panel 20 on which the address electrodes have been formed, and positioned such that the sustaining electrodes and scanning electrodes will intersect with the address electrodes at the proper locations.

After the first and second panels 10, 20 have been adhered together under heating inside the heating vacuum chamber, they are conveyed through the vacuum atmosphere, without being exposed to the outside atmosphere, into a cooling chamber in which a vacuum atmosphere has been formed, and the combined first and second panels 10 and 20 are cooled while the vacuum atmosphere inside the cooling chamber is maintained. The above-mentioned inert gas is then charged in between the first and second panels 10, 20 in a vacuum atmosphere; and this inert gas is sealed to obtain the plasma display panel 1.

Thus, with the manufacturing method of the present invention, the steps at least from forming the protective film 14 on the first panel 10 up to adhering the first and second panels 10 and 20 together and the conveyance between the steps are performed in a vacuum atmosphere, and the first and second panels 10 and 20 are not exposed to the outside atmosphere.

Specifically, from the time the protective film 14 is formed until the first and second panels 10 and 20 are adhered together and the protective film 14 is sealed off, the protective film 14 is not exposed to the outside atmosphere so even though the main components of the protective film 14 are made of highly water-absorbent materials, such as SrO and CaO, the absorption of moisture is prevented.

If SrO or CaO absorbs water, it changes into a hydroxide or the like, and when such SrO or CaO is used in the protective film of a plasma display panel, this alteration will cause a deterioration in discharge time lag, an increase in discharge voltage, and other such problems, and will also result in the initial aging performed to stabilize the discharge characteristics taking longer time. Moisture that gets into the protective film 14 moves to the fluorescent films 22R, 22G, and 22B, and modifies the fluorescent films 22R, 22G, and 22B and diminishes the display performance of the plasma display panel, but with the manufacturing method of the present invention as discussed above, since the protective film 14 is prevented from absorbing moisture in the manufacturing process, discharge drive is possible at a lower discharge voltage, and a plasma display panel 1 with excellent display performance is obtained.

EXAMPLES

SrO—CaO Concentration

Plasma display panels 1 having 300 luminescent cells in the surface thereof were obtained by producing protective films 14 of the first and second panels using various concentrations of SrO and CaO. With each plasma display panel 1, the height of the barrier ribs 23 was 150 μm, the height of the space in which discharge occurred (that is, the height from the tops of the fluorescent films 22R, 22G, 22B on the address electrodes 25 to the top of the protective film 14 on the sustaining electrodes 15 and the scanning electrodes 16) was 80 μm; the inert gas was a mixture of neon and xenon (a mixed gas composed of neon and xenon); the xenon concentration of 12 vol %; and the charging pressure of the inert gas was 400 Torr.

Table 1 shows the CaO concentration (mol %) in the protective film 14.

The CaO concentrations (mol %) in the protective film 14 are shown in the following Table 1.

TABLE 1

Results of measuring discharge voltage and sputtering resistance of SrO—CaO compound oxide film

| CaO concentration in film (mol %) | First cell lighting voltage (V) | Last cell extinguishing voltage (V) | Etching depth after 2000 hours of aging (Å) |
|---|---|---|---|
| 0 | 155 | 103 | 7960 |
| 10 | 160 | 98 | 3440 |
| 20 | 165 | 103 | 2010 |
| 40 | 162 | 103 | 1790 |
| 60 | 165 | 105 | 1750 |
| 80 | 182 | 122 | 1870 |
| 90 | 196 | 134 | 1970 |
| MgO | 225 | 145 | 2700 |

Next, the first cell lighting voltage required to start the discharge of the first of the 300 luminescent cells, and the last cell extinguishing voltage at which the last cell was extinguished when the fully-lit PDP drive voltage was gradually lowered were measured using each of the plasma display panels 1, and these measurement results are given in Table 1. Table 1 also gives measurement results in a case where the protective film 14 was composed of MgO, instead of the protective film of the present invention as described above that contains both SrO and CaO.

In addition, a protective film 14 that was the same as those used in the various plasma display panels 1 was exposed for 2000 hours to a plasma of the above-mentioned charging gas (a neon and xenon mixed gas, containing 12 vol % xenon), the depth to which the protective film 14 was etched (the reduction in film thickness) was measured, and these results are also given in Table 1.

As is clear from Table 1, a protective film containing both SrO and CaO and a protective film composed of just SrO both have a lower discharge voltage than an MgO film.

Also, if we define anti-sputtering property as the inverse of the etching rate at the predetermined voltage given in Table 1, and if we let the anti-sputtering property of an MgO film be 1, when the CaO concentration is 10 mol % or less, the anti-sputtering property of the protective film of the present invention containing both SrO and CaO is less than 1, which is not excellent. However, when the CaO concentration is within the range of 20 mol % or more and 90 mol % or less, the anti-sputtering property is over 1, which is excellent.

The anti-sputtering property of the protective film of the present invention containing SrO and CaO and having a CaO concentration of 20 mol % is approximately 1.34, the anti-sputtering property when the CaO concentration is 60 mol % is approximately 1.54, and the anti-sputtering property when the CaO concentration is 90 mol % is approximately 1.37 so the anti-sputtering property of the protective film of the present invention is best when the CaO concentration is 60 mol %.

When the CaO concentration is 20 mol % or more and 60 mol % or less, the first cell lighting voltage stabilizes at about 160 V and the last cell extinguishing voltage also stabilizes at about 100 V. With such CaO concentration range, there is little variance in discharge characteristics due to differences in CaO concentration so even if there is variance in concentrations between cells, this will not affect drive control.

With the protective film in this embodiment, when the CaO concentration is within the range of 20 mol % or more and 90 mol % or less, if a gas being a mixture gas of neon and xenon that contains 12 vol % xenon is used as the inert gas in order to increase brightness, the discharge voltage will be lower and anti-sputtering property better than when an MgO film is used, which affords a PDP with a longer service life. Therefore, you know that an adequate effect can be anticipated even no less than the 10 vol % xenon concentration specified for a conventional MgO film.

Also, an effect can be anticipated if the height of the discharge space and the inert gas pressure are at the specified settings depending on the PDP design specifications, and an effect can also be anticipated if the PDP has a diagonal size of 42 inches or more.

Vapor Deposition Material Concentration

Using a mixed material of SrO and CaO as the vapor deposition material, this mixed material was irradiated with an electron beam to form the protective film of the present invention containing both SrO and CaO, and the composition of the protective film formed by the aforesaid method was analyzed.

Figure 3:
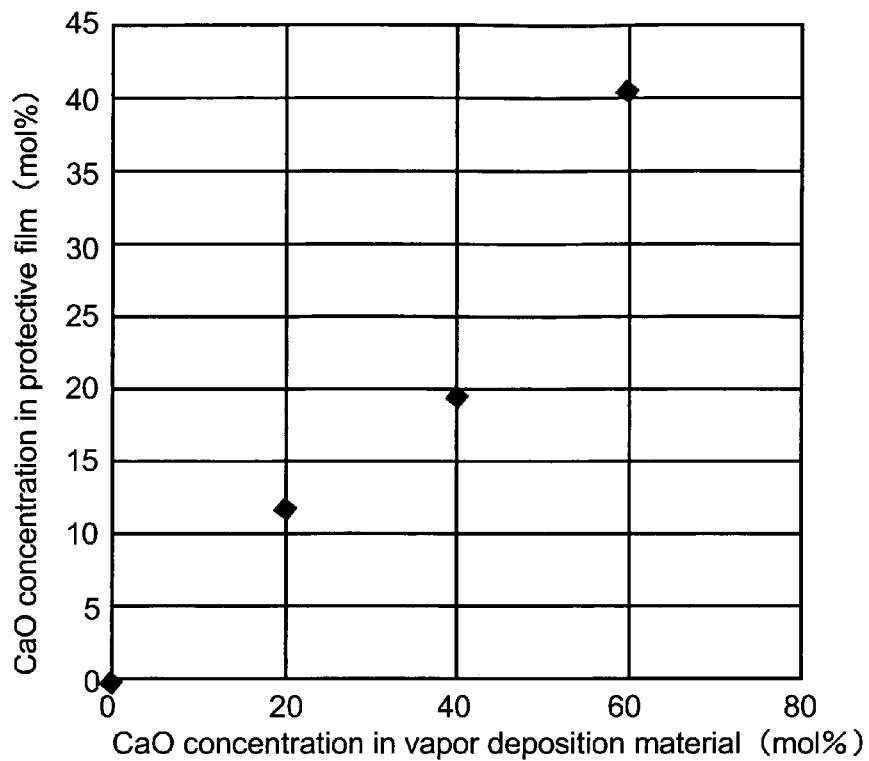
FIG. 3 is a graph of the protective film composition when a mixed vapor deposition material of SrO and CaO is used.

FIG. 3 is a graph of the results of the above compositional analysis. When a mixed material of SrO and CaO is vaporized, a discrepancy comes out between the composition of the mixed material and the composition of the resulting protective film because SrO and CaO have different vaporization pressures. As shown in FIG. 3, the CaO concentration in the vapor deposition material and the CaO concentration in the protective film are in a specific relationship having a displacement point.

Although not shown in the drawings, it was confirmed that this relationship varies dramatically with reduction in the amount of vapor deposition material. Therefore, it is surmised that the composition of the protective film that is formed varies over time from the start of film formation although not shown in the drawings.

In contrast, with the method for forming a protective film of the present invention, as shown in FIG. 2, SrO and CaO are vaporized separately, and the vaporization rate from each vaporization source can be optimized by changing the hearths that are irradiated with the beams, adjusting how long the hearths are irradiated with the beams, the beam irradiation intensity, and other such factors as discussed above. Therefore, with the present invention, in which SrO and CaO are vaporized separately, it is easy to control the ratio of SrO to CaO, and a protective film having a stable compositional ratio can be formed.

When the protective film of the present invention containing both SrO and CaO is to be formed by electron beam vapor deposition, $SrCO_3$ and $CaCO_3$, which are stable in the atmosphere, are generally used for the vapor deposition materials. However, when a protective film was formed from these vapor deposition materials, there was no decrease in the discharge voltage of the PDP.

The composition of the resulting protective film was analyzed. As a result, the protective film contained a large amount of carbon, and it is believed that the secondary electron emission characteristics decreased. It was found that a protective film with a low discharge voltage can be stably obtained by using SrO and CaO, which are vapor deposition materials that are unstable in the atmosphere, and vaporizing them separately.

Continuous Treatment in Vacuum Atmosphere

Treatment was performed according to the procedure shown in Table 2 to comparatively evaluate the effect of performing everything from the formation of the protective film 14 up to the adhering under heating (adhering the first and second panels 10 and 20 together) and subsequent cooling, continuously in a vacuum.

TABLE 2

Comparison procedures of continuous treatment in vacuum versus continuous treatment in dry atmosphere

| Means | Example continuous treatment in vacuum | Comparative Example continuous treatment in dry atmosphere |
|---|---|---|
| 1 | vapor deposition of SrO-20 mol % CaO film | vapor deposition of SrO-20 mol % CaO film |
| 2 | adhering under heating for 30 minutes at 450° C. in vacuum | adhering under heating for 30 minutes at 450° C. in dry nitrogen with a dew point of −40° C., with no exposure to the atmosphere |
| 3 | cooling to room temperature in vacuum | cooling to room temperature in dry nitrogen with a dew point of −40° C., with no exposure to the atmosphere, followed by vacuum exhaust |
| 4 | introduction of Ne-12% Xe discharge gas up to 53.2 kPa, followed by gas sealed | introduction of Ne—12% Xe discharge gas up to 53.2 kPa, followed by gas sealed |
| 5 | measurement of discharge voltage | measurement of discharge voltage |

Figure 4:
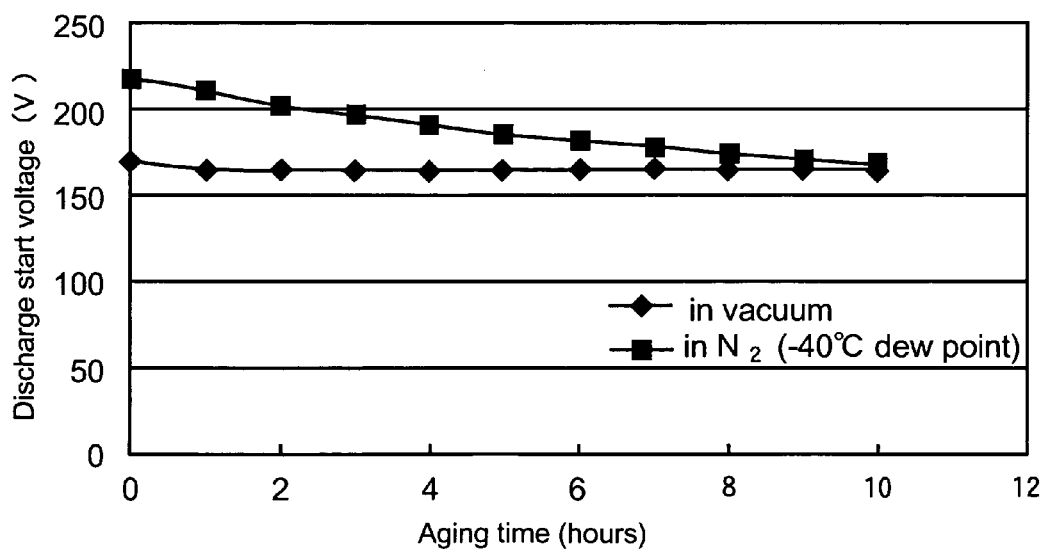
FIG. 4 is a graph of the relation between discharge voltage and aging time.

Using the plasma display panels 1 of the examples and comparative examples, discharge was performed continuously, the change in discharge voltage over time was measured while discharge was performed continuously, and these results are given in the graph of FIG. 4.

Table 2 and FIG. 4 clearly indicate that the discharge voltage of the PDP manufactured by the method of the present invention stabilized at aging of 1 hour of initial discharge.

In contrast, as discussed in Japanese Laid-Open Patent Application 2002-231129, in a comparative example in which everything from the formation of the protective film up to adhering the first and second panels 10 and 20 together was performed in a dry atmosphere of dry gas ($N_2$ gas), discharge voltage did not stabilize even after 10 hours, and it took a very long time for the discharge voltage to stabilize.

When a mixture of SrO and CaO was used for a protective film, it was found that a continuous process performed under a vacuum was far more effective at shortening the initial aging time than a manufacturing process involving a dry atmosphere.

A surface discharge type of PDP was used as an example above. The protective film of the present invention can also be applied to a PDP in which a dielectric film is also disposed on the second panel 20 side, as discussed in Patent Document 1, or to an opposed discharge type of PDP or other such PDP that requires a protective film, and to PDP manufacturing methods.

When the protective film of the present invention is formed on the second panel 20 as well, it is preferable for everything from the formation of the protective film up to adhering the first and second panels 10, 20 together to be performed in a vacuum atmosphere, with no exposure to the outside atmosphere.

The first and second substrates can be made of not only glass substrates but also various materials, such as plastic or ceramic substrates. It is preferable for at least the substrate on the side where light is emitted to be transparent.

The method for forming the protective film is not limited to EB vapor deposition provided CaO vapor and SrO vapor can be generated separately. It is also possible, for example, to heat hearths 3 holding SrO and hearths 4 holding CaO with an electric coil or other such heating means, and generate CaO vapor and SrO vapor separately.

The above description is concerned with the disposition of the protective film 14 of the present invention over the sustaining electrodes 15 and the scanning electrodes 16 via the dielectric film 12, but the present invention is, however, not limited to the above-description, and the protective film 14 may be disposed so as to come into contact with the surface of the sustaining electrodes 15 and the surface of the scanning electrodes 16.

Also, the address electrodes 25 and the fluorescent films 22R, 22G, and 22B will also be protected from the plasma if the protective film 14 is formed over the surface of the fluorescent films 22R, 22G, and 22B.

The above description pertains to the formation of a plasma by applying voltage between scanning electrodes and sustaining electrodes disposed on the same panel, but the present invention is not limited to this. For instance, a plasma may be formed by applying DC or AC voltage between electrodes disposed on different panels. When DC voltage is applied between electrodes on different panels, the protective film of the present invention may be disposed on at least the electrode located on the negative potential side, and when AC voltage is applied between electrodes on different panels, the protective film of the present invention may be disposed on one or both of the electrodes.

What is claimed is:

1. A protective film disposed on surfaces of sustaining electrode of a plasma display panel,
   wherein the plasma display panel includes a first panel and a second panel, a scanning electrode and a sustaining electrode being disposed on a surface of the first panel while being insulated from one another, and an address electrode being disposed on a surface of the second panel and a fluorescent film being disposed on the address electrode,
   wherein an inert gas is charged in between the first and second panels, and by applying voltage between the address electrode and the scanning electrode, a write discharge occurs, and by applying AC voltage between the scanning electrode and the sustaining electrode, a sustaining discharge is brought about, and ultraviolet rays discharged from the plasma which is generated by the sustaining discharge are irradiated to the fluorescent film, thereby being emitted,
   the protective film comprising SrO and CaO, wherein the CaO content is at least 60 mol % and at most 90 mol %, and when AC voltage is applied between the scanning electrode and the sustaining electrode, secondary electron is discharged and the sustaining discharge occurs.

2. A plasma display panel, comprising a first panel and a second panel, a scanning electrode and a sustaining electrode being disposed on a surface of the first panel while being insulated from one another, an address electrode being disposed on a surface of the second panel and a fluorescent film being disposed on the address electrode,
   wherein an inert gas is charged in between the first and second panels, and by applying voltage between the address electrode and the scanning electrode, a write discharge occurs, and by applying AC voltage between the scanning electrode and the sustaining electrode, a sustaining discharge is brought about, and ultraviolet rays discharged from the plasma which is generated by the sustaining discharge are irradiated to the fluorescent film, thereby being emitted,
   a protective film is disposed on the surfaces of the scanning electrode and the sustaining electrode, the protective film contains SrO and CaO, and
   wherein the CaO content is at least 60 mol % and at most 90 mol % and when AC voltage is applied between the scanning electrode and the sustaining electrode, secondary electron is discharged from the protective film and the sustaining discharge is brought about.

3. The plasma display panel according to claim 2, wherein the inert gas contains neon and xenon, and the xenon content is 10 vol % or more.

* * * * *